(12) United States Patent
Maeda

(10) Patent No.: US 6,650,375 B1
(45) Date of Patent: Nov. 18, 2003

(54) TELEVISION SIGNAL TRANSMITTER FOR ELIMINATING INTERFERENCE CAUSED BY DIFFERENTIAL SIGNAL OF TWO FREQUENCY CONVERTERS

(75) Inventor: Kazuyuki Maeda, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 574 days.

(21) Appl. No.: 09/686,687

(22) Filed: Oct. 11, 2000

(30) Foreign Application Priority Data

Oct. 12, 1999 (JP) .......................................... 11-289662

(51) Int. Cl.$^7$ ................................................. H04N 5/40
(52) U.S. Cl. ......................... 348/724; 348/21; 455/316
(58) Field of Search ................................. 348/723, 724, 348/21, 470, 607, 614; 331/2, 16, 39, 41; 455/260, 314–318

(56) References Cited

U.S. PATENT DOCUMENTS

| | | | |
|---|---|---|---|
| 4,569,084 A | * 2/1986 | Takahama | ................... 455/131 |
| 5,812,928 A | * 9/1998 | Watson, Jr. et al. | ......... 455/5.1 |
| 5,847,612 A | 12/1998 | Birleson | |
| 5,940,143 A | * 8/1999 | Igarashi et al. | ............. 348/678 |
| 6,271,603 B1 | * 8/2001 | Kajita | .......................... 307/43 |
| 6,307,896 B1 | * 10/2001 | Gumm et al. | ............... 375/316 |

* cited by examiner

Primary Examiner—Victor R. Kostak
(74) Attorney, Agent, or Firm—Brinks Hofer Gilson & Lione

(57) ABSTRACT

The frequency converters have first mixers for frequency converting input intermediate frequency band television signals into first intermediate frequency band television signals, first local oscillators for inputting the first local oscillation signals into the first mixers, second mixers for frequency converting the first intermediate frequency band television signals into the broadcasting channel television signals, and second local oscillators for inputting second local oscillation signals into the second mixers, wherein the frequency of the first local oscillation signals in the first frequency converter and the frequency of the first local oscillation signals in the second frequency converter are different from each other by 0.25 MHz or more.

3 Claims, 1 Drawing Sheet

TELEVISION SIGNAL TRANSMITTER FOR ELIMINATING INTERFERENCE CAUSED BY DIFFERENTIAL SIGNAL OF TWO FREQUENCY CONVERTERS

BACKGROUND OF THE INVENTION

1. Field of the Invention

The present invention relates to a television signal transmitter used in for example a CATV system, for frequency converting intermediate frequency band signals of television to the television signals of broadcasting channels.

2. Description of the Related Art

FIG. 2 shows a circuit arrangement of primary part of a television signal transmitter in the Prior Art, having two systems of frequency converters, namely a first frequency converter 11 and a second frequency converter 12 for frequency converting intermediate frequency band signals of television (referred to as IF signal herein below) to television signals of broadcasting channel frequency (referred to as television signals, herein below). These frequency converters 11 and 12 are housed in a same housing.

The first frequency converter 11 and the second frequency converter 12 have the identical configuration; the first frequency converter 11 has a first mixer 11a for frequency converting the IF signals to a first IF signals of higher frequency, a first local oscillator 11b for inputting to the first mixer 11a first local oscillation signals, a second mixer 11c for frequency converting the first IF signals to the television signals, and second local oscillator 11d for inputting to the second mixer 11c second local oscillation signals.

Similarly, the second frequency converter 12 has also a first mixer 12a, first local oscillator 12b, second mixer 12c, and second local oscillator 12d.

The contents of IF signals input to the first mixers 11a and 12a of respective first and second frequency converters 11 and 12 (program contents) are different from each other. Thus the television signals output from the second mixers 11c and 12c are output at mutually different channel frequency. These television signals are mixed by a mixer 13 to send to subscribers of a CATV system through cables not shown in the figure.

In the above configuration, the frequency of first IF signals is preset to a predefined frequency so that the same frequency of first local oscillation signals will be output from two first local oscillators 11b and 12b respectively. Since the channel of television signals output from the second mixers 11c and 12c are mutually different from each other, the frequency of second local oscillation signals output from each of second local oscillators 11d and 12d will be different from each other by frequency of at least one channel.

In the television signal transmitter of the Prior Art as above, the first local oscillation signals are preset to the same frequency, however, in practice, these frequencies are not perfectly matched but slightly different from each other due to the constant inconsistency of parts used for the first local oscillators.

Therefore, for example, it is possible that the first local oscillation signals of the first frequency converter may be leaked and input to the second frequency converter, or on the contrary, the second local oscillation signals of the second frequency converter is leaked and input to the first frequency converter. Then, in each frequency converter, first local oscillation signals and second local oscillation signals may be intermixed at the first mixer or elsewhere to create differential signals of these frequencies. The differential signal level will be larger if the difference in frequencies is smaller, in other words if the frequencies of the first local oscillation signals are closer to each other, thereby to appear as interference in the proximity of video carrier of television signals.

As a result, interference fringes will be appeared on the screen when receiving such television signals, causing considerable degradation of video image quality.

SUMMARY OF THE INVENTION

The present invention has been made in view of the above circumstances and has an object to overcome the above problems and to provide a television signal transmitter that can eliminate interference caused by the differential signal of frequencies generated by the respective first local oscillation signals of two frequency converters.

To achieve the objects and in accordance with the purpose of the invention, as embodied and broadly described herein, there is provided a television signal transmitter, comprising a first frequency converter and a second frequency converter each outputting by frequency converting the intermediate frequency band television signals into mutually different broadcasting channel television signals, each of the frequency converters including a first mixer for frequency converting television signals of the intermediate frequency band to television signals of first intermediate frequency band of frequency higher than the television signals frequency of the intermediate frequency band, a first local oscillator for generating first local oscillation signals to be input to the first mixer, a second mixer for frequency converting the first intermediate frequency band television signals into the broadcasting channel television signals, and a second local oscillator for generating second local oscillation signals to be input to the second mixer; wherein the frequency of the first local oscillation signals in the first frequency converter is different from the frequency of first local oscillation signals in the second frequency converter by 0.25 MHz.

In addition, the television signal transmitter in accordance with the present invention further comprises a band pass filter, between the first mixer and the second mixer, having a broader pass band than the frequency band of the first intermediate frequency band television signals in both the first frequency converter and the second frequency converter, wherein the frequency of first local oscillation signals in the first frequency converter and the frequency of first local oscillation signals in the second frequency converter may be set to any one of frequencies of integer times of 0.25 MHz respectively with respect to a predetermined reference frequency.

In addition, the television signal transmitter in accordance with the present invention further comprises a PLL circuit separately for each of the frequency converter for controlling respectively the first local oscillator and a microcomputer for storing frequency data for setting the frequency of first local oscillation signals in the first frequency converter and the frequency of first local oscillation signals in the second frequency converter, wherein the microcomputer inputs the frequency data to each of the PLL circuits.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

DETAILED DESCRIPTION OF THE PREFERRED EMBODIMENTS

Figure 1:
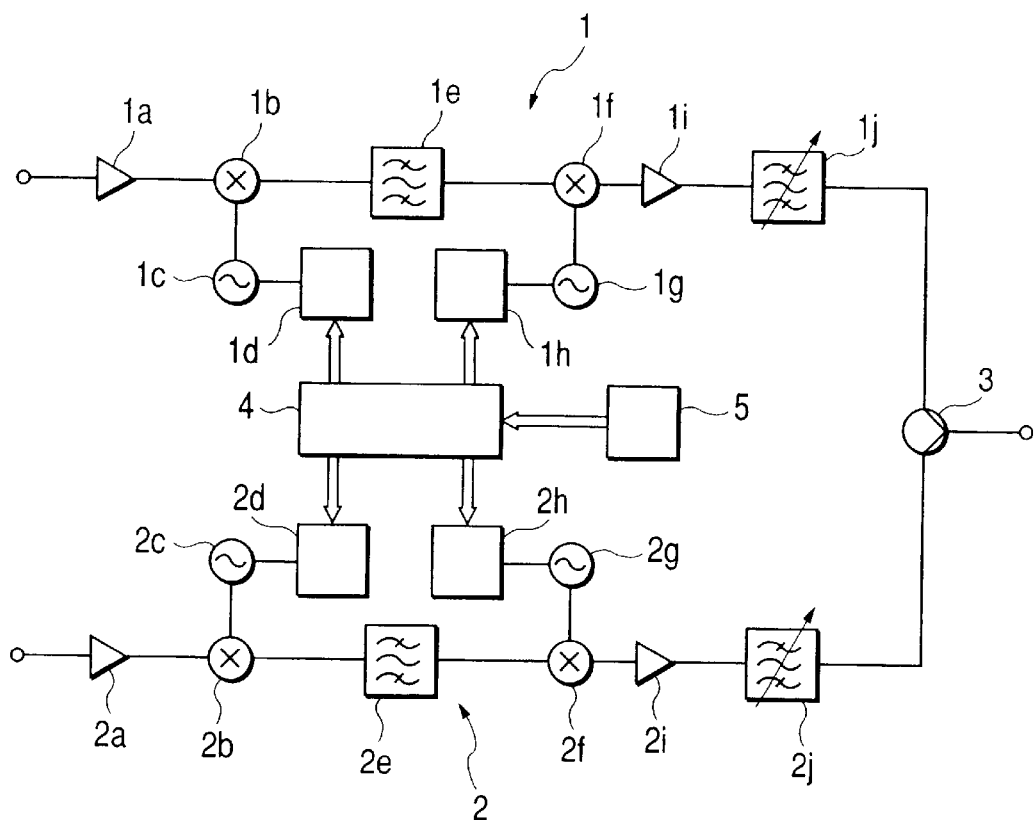
FIG. 1 is a circuit diagram illustrating the configuration of television signal transmitter in accordance with the present invention.
Figure 2:
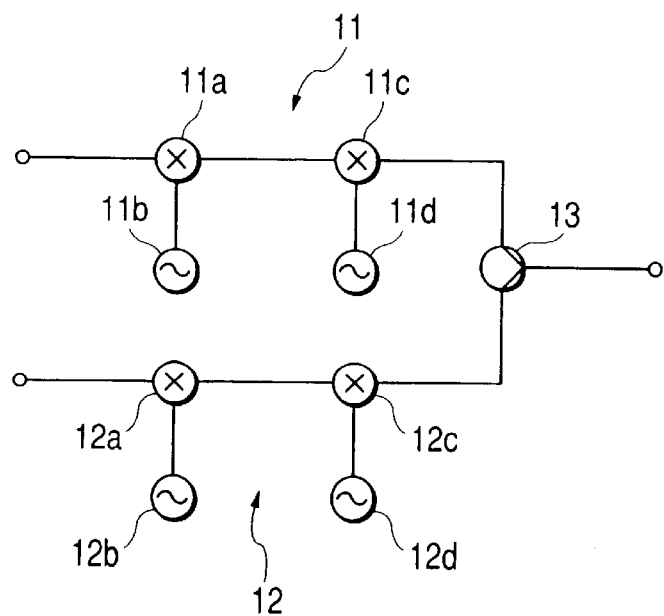
FIG. 2 is a circuit diagram illustrating the configuration of television signal transmitter in accordance with the Prior Art.

A detailed description of the preferred embodiment embodying the television signal transmitter in accordance with the present invention will now be given referring to the accompanying drawings. Now referring to FIG. 1, the television signal transmitter in accordance with the present invention has two systems of frequency converters for frequency converting the input intermediate frequency band television signals to output broadcasting channel television signals, namely a first frequency converter 1 and a second frequency converter 2, a third mixer 3 for intermixing broadcasting channel television signals output from the first frequency converter 1 and the second frequency converter 2, a microcomputer 4 (referred to as an MPU herein below) for controlling the first and second frequency converters 1, 2. These frequency converters 1 and 2 and the like are integrated into the same housing (not shown) which constitutes a television signal transmitter.

Here, the intermediate frequency band television signals means the intermediate frequency band television signals of so-called television system, with for example 45.75 MHz of picture IF signals and 41.25 MHz of audio IF signals in the U.S. specification.

The intermediate frequency band television signals input into the first frequency converter 1 has a picture signal and audio signal different from a picture signal and audio signal of the intermediate frequency band television signals input into the second frequency converter 2.

The broadcasting channel television signals means television signals allocated to a broadcasting channel, which may have different frequency for each channel.

The first frequency converter 1 and the second frequency converter 2 have the same configuration, the frequency converter 1 has an input amplifier 1a for inputting intermediate frequency band television signals, first mixer 1b for frequency converting the input intermediate frequency band television signals to a first intermediate frequency band television signals of frequency higher than the input signals, a first local oscillator 1c for generating first local oscillation signals to be input to the first mixer 1b, a first PLL circuit 1d for controlling the frequency of first local oscillation signals, a band pass filter 1e for filtering the first intermediate frequency band television signals, a second mixer if for frequency converting the first intermediate frequency band television signals into the broadcasting channel television signals, a second local oscillator 1g for generating second local oscillation signals to be input to the second mixer 1f, a second PLL circuit 1h for controlling the frequency of second local oscillation signals, a power amplifier 1i, and an output filter 1j. These are connected as shown in FIG. 1.

Similarly, the second frequency converter 2 has an input amplifier 2a, a first mixer 2b, a first local oscillator 2c, a first PLL circuit 2d, a first IF filter 2e, a second mixer 2f, a second local oscillator 2g, a second PLL circuit 2h, a power amplifier 2i, and an output filter 2j. These are connected as shown in FIG. 1.

To the input amplifier 1a and input amplifier 2a, intermediate frequency band television signals having different picture signals and audio signals are input. The frequency of the first intermediate frequency band television signals (frequency of the picture carrier) is based on a reference frequency of 1300 MHz, thus the frequency of first local oscillation signals will be based on a reference frequency of 1254.25 MHz. The frequency of the first local oscillation signals may be tuned within a certain range, the frequency may be set by the first PLL circuit 1d and first PLL circuit 2d. The minimal step frequency at this point is 0.0125 MHz.

The band pass filters 1e and 2e has their pass band of approximately 7 to 8 MHz (for example, 1293 MHz to 1301 MHz), which is broader than the television signals band of first intermediate frequency band (4.5 MHz). The reason for setting a broader pass band is to address to the inconsistency of carrier characteristics in the pass band of band pass filter 1e and first IF filter 2e, and it may be possible to output the frequency of broadcasting channel television signals more or less shifted from a reference frequency. The amount of shift is usually ±0.1125 MHz.

The broadcasting channel television signals output from the first frequency converter 1 and the broadcasting channel television signals output from the second frequency converter 2 are both set so as to be at different broadcasting channels. These broadcasting channels will be determined by the CATV system.

Accordingly the frequency of second local oscillation signals in the first frequency converter 1 and the frequency of second local oscillation signals in the second frequency converter 2 are different from each other by at least one channel of frequency.

The frequency of second local oscillation signals may be higher than the frequency of first intermediate frequency band television signals by the frequency of broadcasting channel television signals. However, since the broadcasting channel television signals are different in frequencies in accordance with the preset broadcasting channels, the frequency may be changed in a range from approximately 1350 MHz to 2350 MHz so as to correspond to every channel frequencies. In addition, the frequency of second local oscillation signals is set by the second PLL circuits 1h and 2h. The minimal step frequency at this point is set to 0.125 MHz.

The output filters 1j and 2j are composed of variable frequency band pass filters to alter the center frequency of pass band in correspondence with the frequency of broadcasting channel television signals, in cooperation with the frequency of second local oscillation signals.

To two first PLL circuits 1d and 2d and two second PLL circuits 1h and 2h, the frequency data for setting the frequency of first and second local oscillation signals (more specifically, the frequency dividing rate data of variable frequency dividers in each PLL circuit) is fed from the microcomputer 4 (MPU). The MPU 4 has a memory therein, to which the data for setting frequency input from an input means 5 such as a keyboard is stored.

In the above configuration, the frequency of first intermediate frequency band television signals in either one frequency converter, for example frequency converter 1 is set to be at the reference frequency (1300 MHz).

In this case, the frequency of first IF signals in the first frequency converter 1 will be also set to be at the reference frequency 1254.25 MHz (=1300 MHz–45.75 MHz). This setting is performed by the first PLL circuit 1d.

On the other hand, the frequency of first local oscillation signals in the second frequency converter 2 will be set to be 0.25 MHz higher than the frequency of first local oscillation signals in the first frequency converter 1, for example, to 1254.75 MHz that is 0.5 MHz higher. This setting also is performed by the first PLL circuit 2d. Accordingly the frequency of first intermediate frequency band television signals in the second frequency converter 2 will be 1300.5 MHz (=45.75 MHz+1254.75 MHz).

As a result, the frequency difference between first local oscillation signals in both frequency converters 1 and 2 will be 0.5 MHz apart from each other, sufficient for preventing the degradation of picture quality since the interference signal level may be considerably reduced when two frequencies are separated away from each other by 0.25 MHz or more.

In accordance with the frequency of first local oscillation signals in the second frequency converter 1 to be set higher by 0.5 MHz, the frequency of second local oscillation signals in the second frequency converter 2 also will be set by 0.5 MHz higher than the second local oscillation signals corresponding to the reference frequency of the output broadcasting channel.

Now considering that the frequency of broadcasting channel television signals that is output from the first frequency converter 1 is shifted by 0.1125 MHz higher with respect to the reference frequency, while the frequency of broadcasting channel television signals that is output from the second frequency converter 2 is shifted by 0.1125 MHz lower than the reference frequency. In such a case, the frequency of the first local oscillation signals in the first frequency converter 1 will be 1254.3625 MHz (=1254.25 MHz+0.1125 MHz), and the frequency of first local oscillation signals in the second frequency converter 2 will be 1254.6375 MHz (=1254.75 MHz−0.1125 MHz), the difference therebetween will be 0.275 MHz. Consequently, the frequency difference between the first local oscillation signals will be 0.275 MHz, which satisfies the criteria of 0.25 MHz, allowing the interference signal level to be reduced.

On the other hand, the pass band of the band pass filters 1e and 2e is set to be wider than the bandwidth of the first intermediate frequency band television signals. This is for flattening as much as possible the television signals of output broadcasting channel by matching the bandwidth of first intermediate frequency band television signals with the most flat bandwidth within the pass band of the band pass filters 1e and 2e. To do this, the difference between the frequency of first local oscillation signals in the first frequency converter 1 and the frequency of first local oscillation signals in the second frequency converter 2 will be maintained to be more than 0.25 MHz while both frequencies will be shifted to frequencies separated away from the reference frequency by 0.25 MHz.

Consequently, the frequency of television signals of the first local oscillation signals will be shifted, so that in response to the amount of shift thereof the frequency of the second local oscillation signals will be shifted by the same amount. Then the frequency of television signals of output broadcasting channel will remain to the original frequency.

The frequency data determining the amount of shift will be input from the microcomputer 4 to the first PLL circuits 1d and 2d as well as the second PLL circuits 1h and 2h.

As have been described above, in the television signal transmitter in accordance with the present invention, first and second frequency converters each have respectively a first mixer for frequency converting the input intermediate frequency band television signals into first intermediate frequency band television signals, a first local oscillator for inputting the first local oscillation signals into the first mixer, a second mixer for frequency converting the first intermediate frequency band television signals into the broadcasting channel television signals, and a second local oscillator for inputting the second local oscillation signals into the second mixer, the frequency of first local oscillation signals in the first frequency converter and the frequency of first local oscillation signals in the second frequency converter are different from each from other by 0.25 MHz to significantly reduce the interference signal level caused by the frequency difference between both first local oscillation signals, which may sufficiently prevent the degradation of picture quality.

Furthermore, the television signal transmitter in accordance with the present invention further comprises a band pass filter, between the first mixer and the second mixer, having a broader pass band than the frequency band of the first intermediate frequency band television signals in both the first frequency converter and the second frequency converter, and the frequency of first local oscillation signals in the first frequency converter and the frequency of second local oscillation signals in the second frequency converter may be set to any one of frequencies of integer times of 0.25 MHz respectively with respect to a predetermined reference frequency, so that the television signals bandwidth of the first intermediate frequency band may be matched to the most flat bandwidth within the pass band of the band pass filters. Accordingly, the television signals of output broadcasting channel will be flatten.

Also, the television signal transmitter in accordance with the present invention further comprises a PLL circuit separately for each of the frequency converter for controlling respectively the first local oscillator, and a microcomputer for storing frequency data for setting the frequency of first local oscillation signals in the first frequency converter and the frequency of first local oscillation in the second frequency converter, and the microcomputer inputs the frequency data to each of the PLL circuits, so that the frequency of both first local oscillation signals may be positively defined.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A television signal transmitter, comprising:

first and second frequency converters for outputting by frequency converting intermediate frequency band television signals to broadcasting channel television signals which are different from each other, each of the frequency converters comprising:

a first mixer for frequency converting the intermediate frequency television signals to television signals of first intermediate frequency band which has higher frequency than that of the intermediate frequency band television signals;

a first local oscillator for generating first local oscillation signals input to the first mixer;

a second mixer for frequency converting the first intermediate frequency band television signals to the television signals of the broadcasting channel band; and a second local oscillator for generating second local oscillation signals input to the second mixer;

wherein the frequency of first local oscillation signals in the first frequency converter and the frequency of first local oscillation signals in the second frequency converter are different from each from other by 0.25 MHz or more.

2. A television signal transmitter according to claim 1, further comprising:

a band pass filter provided for each of the first frequency converter and the second frequency converter between the first mixer and the second miser respectively, having a pass band broader than the frequency band of television signals of the first intermediate frequency band, in order to set both the frequency of the first local oscillation signal in the first frequency converter and the frequency of the first local oscillation signal in the second frequency converter to any one frequency of integral times of 0.25 MHz with respect to a predetermined reference frequency.

3. A television signal transmitter according to claim 2, further comprising:

a PLL circuit for each frequency converter for independently controlling each of the first local oscillator; and a microcomputer for storing frequency data for setting the frequency of first local oscillation signals in the first frequency converter and the frequency of first local oscillation in the second frequency converter;

wherein the microcomputer inputs the frequency data to each of the PLL circuits.

* * * * *

UNITED STATES PATENT AND TRADEMARK OFFICE
CERTIFICATE OF CORRECTION

PATENT NO. : 6,650,375 B1
DATED : November 18, 2003
INVENTOR(S) : Kazuyuki Maeda It is certified that error appears in the above-identified patent and that said Letters Patent is hereby corrected as shown below:

Title page,
Item [57], ABSTRACT,
Line 1, before "The frequency" insert -- A television signal transmitter has at least two frequency converters. --.
Line 9, delete "mixers, wherein the" and substitute -- mixers. The -- in its place.

Column 6,
Lines 56-57, delete "for outputting by frequency converting" and substitute -- to frequency convert -- in its place.
Line 59, delete "which are" and substitute -- and output the broadcast channel television signals the intermediate frequency band television signals and broadcast channel television signals being -- in its place.
Line 61, delete "for frequency converting" and substitute -- to frequency convert -- in its place.
Line 63, delete "first intermediate frequency band which has" and substitute -- a first intermediate frequency band, the intermediate frequency band having a -- in its place.
Line 64, delete "that of" and substitute -- a frequency of -- in its place.
Line 66, delete "for generating" and substitute -- to generate -- in its place.

Column 7,
Line 1, delete "for frequency converting" and substitute -- to frequency convert -- in its place.
Line 5, delete "for generating" and substitute -- to generate -- in its place.
Line 7, after "wherein" delete "the" and substitute -- a -- in its place.
Line 11, after "other by" delete "0.25 MHz or more" and substitute -- at least 0.25 MHz. -- in its place.
Line 16, delete "miser" and substitute -- mixer -- in its place.

UNITED STATES PATENT AND TRADEMARK OFFICE
CERTIFICATE OF CORRECTION

PATENT NO. : 6,650,375 B1
DATED : November 18, 2003
INVENTOR(S) : Kazuyuki Maeda It is certified that error appears in the above-identified patent and that said Letters Patent is hereby corrected as shown below:

Column 8,
Line 8, after "converter" delete "for" and substitute -- to -- in its place.
Line 9, delete "controlling each of the" and substitute -- control the respective -- in its place.
Line 10, delete "for storing" and substitute -- to store -- in its place.

Signed and Sealed this

Eleventh Day of May, 2004

JON W. DUDAS
*Acting Director of the United States Patent and Trademark Office*